United States Patent [19]
Kobiki et al.

[11] Patent Number: 5,434,094
[45] Date of Patent: Jul. 18, 1995

[54] METHOD OF PRODUCING A FIELD EFFECT TRANSISTOR

[75] Inventors: Michihiro Kobiki; Masahiro Yoshida; Takahide Ishikawa, all of Itami, Japan

[73] Assignee: Mitsubishi Denki Kabushiki Kaisha, Tokyo, Japan

[21] Appl. No.: 224,882

[22] Filed: Apr. 8, 1994

Related U.S. Application Data

[60] Division of Ser. No. 46,920, Apr. 14, 1993, Pat. No. 5,324,981, which is a continuation of Ser. No. 370,249, Jun. 22, 1989, abandoned.

[30] Foreign Application Priority Data

Jul. 8, 1988 [JP] Japan .................. 63-165752

[51] Int. Cl.$^6$ .......................... H01L 21/8252
[52] U.S. Cl. .......................... 437/40; 437/227; 437/902; 437/912; 437/974; 148/DIG. 28
[58] Field of Search ............... 437/40, 227, 226, 902, 437/974, 911, 912; 148/DIG. 135, DIG. 28

[56] References Cited

U.S. PATENT DOCUMENTS

| | | | |
|---|---|---|---|
| 3,383,760 | 5/1968 | Shwartzman | 437/227 |
| 3,895,429 | 7/1975 | Huang et al. | 437/227 |
| 3,938,176 | 2/1976 | Sloan, Jr. | |
| 3,986,196 | 10/1976 | Decker et al. | |
| 4,023,260 | 5/1977 | Schneider | |
| 4,180,422 | 12/1979 | Rosvold | |
| 4,219,827 | 8/1980 | Kaiser | |
| 4,219,835 | 8/1980 | Van Loon et al. | 148/DIG. 28 |
| 4,237,600 | 12/1980 | Rosen et al. | |
| 4,255,212 | 3/1981 | Chappell et al. | 437/902 |
| 4,384,400 | 5/1983 | Rosen et al. | |
| 4,486,767 | 12/1984 | Fraleux et al. | |
| 4,532,699 | 8/1985 | Bourdillot et al. | |
| 4,537,654 | 8/1985 | Berenz et al. | |
| 5,338,967 | 8/1994 | Kosaki | 437/226 |

FOREIGN PATENT DOCUMENTS

| | | |
|---|---|---|
| 0041890 | 12/1981 | European Pat. Off. |
| 0142216 | 5/1985 | European Pat. Off. |
| 0188879 | 7/1986 | European Pat. Off. |
| 0261013 | 3/1988 | European Pat. Off. |
| 1425906 | 12/1965 | France |
| 2307374 | 11/1976 | France |
| 57-49252 | 3/1982 | Japan .......... 437/227 |
| 57-107039 | 7/1982 | Japan .......... 437/227 |
| 59-94818 | 5/1984 | Japan |
| 59-117171 | 7/1984 | Japan |
| 61-77369 | 4/1986 | Japan |
| 62-94965 | 5/1987 | Japan |
| 62-122278 | 6/1987 | Japan |
| 62-122279 | 6/1987 | Japan |
| 62-211962 | 9/1987 | Japan |
| 63-155673 | 6/1988 | Japan |
| 633848 | 12/1949 | United Kingdom |
| 864121 | 3/1961 | United Kingdom |
| 1099381 | 1/1968 | United Kingdom |
| 1476585 | 6/1977 | United Kingdom |
| 2136203 | 9/1984 | United Kingdom |
| 2150749 | 7/1985 | United Kingdom |
| 2182200 | 5/1987 | United Kingdom |

OTHER PUBLICATIONS

Saito et al, "X and Ku Band High Efficiency Power GaAs FETs", IEEE MTT-S Digest, pp. 265–267, 1983.

Goel et al, "An 8.0 Watt K-Band FET Amplifier For Satellite Downlink", 1983 IEEE MTT-S Digest, pp. 273–275.

D'Asaro et al, "Plasma-Etched Via Connections to GaAs FET's", The Institute of Physics Conference, 1980, pp. 267–273.

Primary Examiner—Brian E. Heran
Assistant Examiner—Michael Trinh
Attorney, Agent, or Firm—Leydig, Voit & Mayer

[57] ABSTRACT

FET devices according to the invention are made by etching separation grooves and the via-holes from the front surface of the substrate. Thereafter, the thickness of the substrate is reduced from the rear surface to expose the plating in the via-holes and separation grooves. A rear surface electrode and a plated heat sink are sequentially deposited on the rear surface of the thinned substrate. The devices are divided from a wafer by etching and/or severing along the separation grooves and at opposed locations along the plated heat sink.

11 Claims, 10 Drawing Sheets

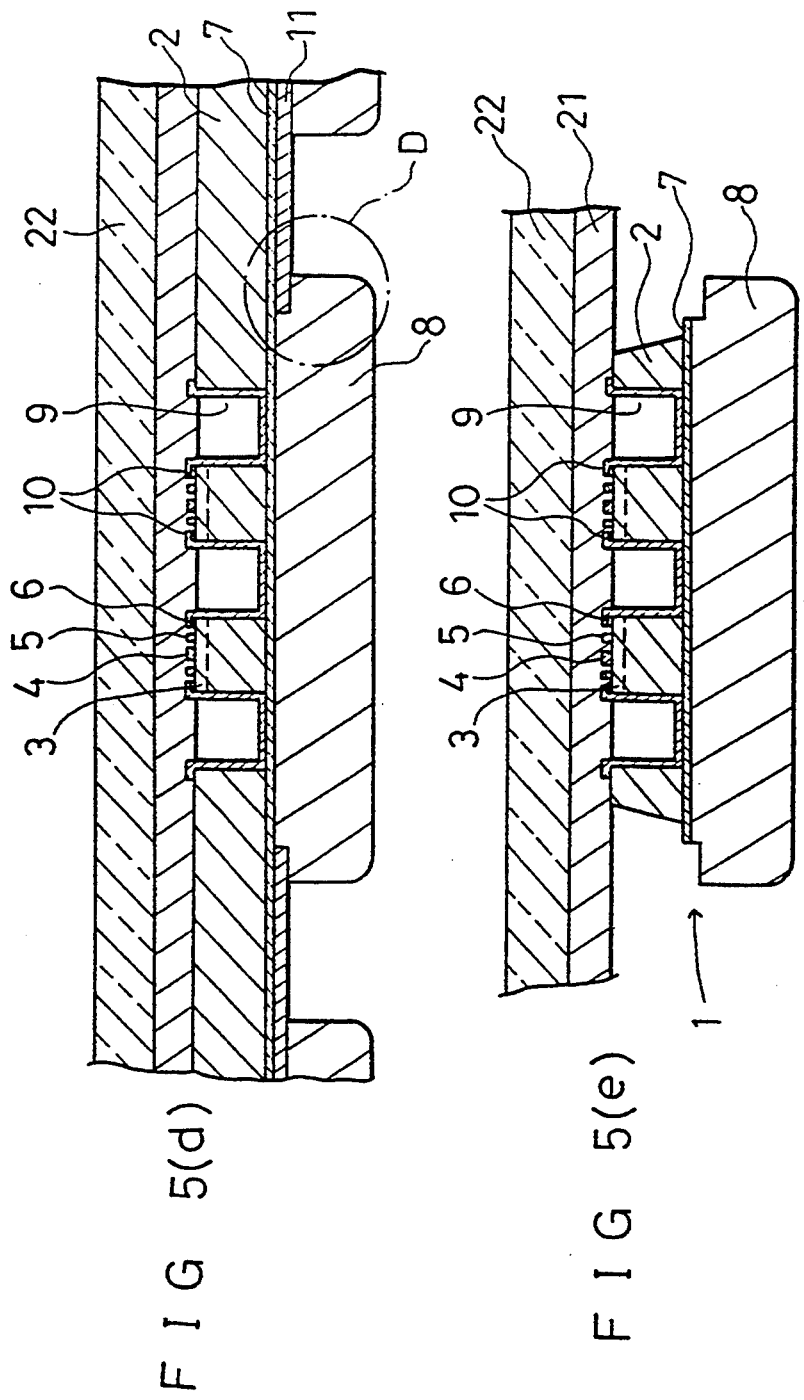

METHOD OF PRODUCING A FIELD EFFECT TRANSISTOR

This disclosure is a division of application Ser. No. 08/046,920, filed Apr. 14, 1993, U.S. Pat. No. 5,324,981 which is a continuation of application Ser. No. 07/370,249, filed Jun. 22, 1989, now abandoned.

FIELD OF THE INVENTION

The present invention relates to a field effect transistor device and a production method therefor and particularly to a high power field effect transistor device including via-hole electrodes.

BACKGROUND OF THE INVENTION

FIG. 4 shows a prior art high power field effect transistor (FET) device 1. The terms FET and FET device as used here respectively refer to a field effect transistor have single source, gate, and drain electrode elements and to an integrated structure incorporating a complex field effect transistor structure, i.e., a structure having more than one gate, source, and drain electrode element. Device 1 includes several interconnected field effect transistor electrode elements, i.e., two drain fingers, four gate fingers, and three source elements that are respectively electrically connected to common drain, gate, and source electrodes. While FIG. 4 shows a single FET, multiple, interconnected FET structures, each FET having the general arrangement of FIG. 4, may be constructed on a single substrate. An example of such a multiple, interconnected FET structure employing five FETs disposed on a single substrate and electrically connected in parallel is disclosed by Saito et al in "X and Ku Band High Efficiency Power GaAs FETs", 1983 IEEE MTT-S Digest, pages 265-267.

The FET device 1 includes a gallium arsenide (GaAs) substrate 2, an active region 3 disposed at a front surface of the GaAs substrate 2, and a gate electrode 5 having four gate fingers disposed on the front surface of the GaAs substrate 2. A drain electrode 4 disposed on the front surface of the substrate 2 includes two drain fingers. The source electrode 6 includes four source elements. Each of the gate fingers is disposed between one of the source electrode elements and one of the drain fingers. In the structure of FIG. 4, a single drain finger of drain electrode 4 serves two FET elements since a gate finger and a source electrode element lie on each of the two opposite sides of each drain finger of drain electrode 4.

Via-holes 9 extend through the GaAs substrate 2 from the front surface to the rear surface adjacent the source electrode elements. A via-hole electrode 10 is disposed in each of the via-holes 9. An electrode 7 disposed at the rear surface of substrate 2 is in electrical communication with the source electrode 6 through the via-hole electrodes 10. The substrate 2 is mounted on and is in electrical and thermal communication with a plated heat sink (PHS) 8 that is formed by electrolytic plating using the rear surface electrode 7 as a plating electrode.

FIG. 9 shows a wafer 100 on which a plurality of FET devices 1 have been formed. Wafer 100 forms the substrate of each device. After the devices on the wafer 100 are completed, the wafer 100 is divided into the individual FET devices 1 by severing, fracturing, etching, or the like.

FIGS. 5(a)-5(e) are cross-sectional views of the FET device 1 taken along line V—V of FIG. 4. FIGS. 5(a)-5(e) illustrate the steps in a process for making the single FET device 1. Saito et al have not fully disclosed the process steps they employ in making their multiple, interconnected FET. Therefore, the process steps illustrated in FIGS. 5(a)-5(e) may not be the same as those employed by Saito et al. The steps illustrated in FIGS. 5(a)-5(e) are somewhat similar to those illustrated in Japanese Published Patent Application 62-122279. Usually, a plurality of FET devices 1 are actually manufactured on a single wafer 100. However, only one device is shown in FIGS. 5(a)-5(e) for simplicity. Reference to substrate 2 means wafer 100 in the process described below until the step in which the wafer 100 is divided into individual FET devices 1.

As illustrated in FIG. 5(a), silicon is implanted in a portion of the front surface of the p-type or semi-insulating GaAs wafer 100. Generally, that substrate has a thickness of about 600 microns and ions are implanted to produce a dopant concentration of about $3 \times 10^{17}/cm^3$ near the front surface of the wafer. With the usual background doping level of the wafer 100, the resulting n-type active region 3 has a depth of about 0.4 micron. The drain electrode 4, the source electrode 6, and the gate electrode 5, including their respective fingers, are deposited, defined, and arranged on the active region 3 as shown in FIG. 5(a). The drain and source electrodes 4 and 6 form ohmic contacts with the wafer 100. Those contacts may be made from an alloy of gold and germanium. Aluminum, titanium, or platinum is deposited as the gate electrode 5 and forms a Schottky barrier with the n-type region 3. The arrangement of the electrodes relative to each other is achieved with conventional metal deposition and photolithographic techniques.

A mask, such as a photoresist mask, is applied to the front surface of the wafer 100 and formed into a pattern to define the areas of via-holes 9 adjacent the source electrodes 6. The via-holes 9, typically having a depth and width of about 30 microns, are formed by etching. Gold is selectively plated on the internal walls of the via-holes 9 and adjacent the periphery of the via-holes 9 to a thickness of about 3 microns. The deposited gold produces via-hole electrodes 10 that are electrically connected to the source electrode elements 6 as shown in FIG. 5(b).

The wafer 100 that forms the GaAs substrate 2 of each of the devices 1 is mounted at its front surface to a glass plate 22 with, for example, wax 21 or another adhering material. The wafer 100 is ground or lapped on its rear surface until its thickness is reduced to about 60 microns. Subsequently, through a combination of mechanical and chemical polishing, the substrate is made still thinner. The rear surface of the wafer 100 may be mechanically and chemically polished simultaneously by rubbing it against a cloth to which an etching solution is periodically applied, for example, by dripping a liquid etchant onto the cloth. Eventually, the via-hole electrodes 10 are exposed at the rear surface of the substrate, as shown in FIG. 5(c), when the thickness of the substrate is reduced to about 25 to 30 microns. Similarly, Saito et al state that in the preparation of their device including five interconnected FETs, the substrate is chemically etched from the bottom side to reach the source pads. Likewise, the substrates in the processes illustrated in Japanese Published Patent Document 62-122279 are etched from their rear surfaces to reduce their thicknesses.

After the electrodes 10 are exposed, a metallic electrode 7 is deposited on the rear surface of wafer 100 in mechanical and electrical contact with electrodes 10. The electrode 7 may have three successively deposited metallic layers, such as titanium, gold, and titanium. A mask 11 of a photoresist is deposited on electrode 7 and formed into a pattern defining separation portions on electrode 7 for later separation of wafer 100 into individual FET devices 1. The resist is removed from the areas corresponding to the FET devices 1, thereby exposing the electrode 7 in the areas of those FET devices. The outermost titanium layer is removed selectively, exposing the underlying gold film for a subsequent plating step. A metal, usually gold, is deposited by an electrolytic plating process on the exposed portions of electrode 7 to a thickness of about 60 microns, thereby forming the PHS 8 at the rear surface of the wafer 100, as shown in FIG. 5(d).

In the Saito et al device the chip bottom is plated to form the PHS and the side walls of the chip are plated simultaneously. Saito et al do not disclose whether several of their devices are manufactured on a single wafer simultaneously or whether single devices are prepared on discrete chips. Whatever processing Saito et al use gives access to both the chip side wall and the PHS area so that they can be plated simultaneously. (The process of FIG. 5(d) does not provide that simultaneous dual access.) Thus, Saito et al form a protective side wall plated metal (gold) layer around the side wall of the substrate 2 of FIGS. 4 and 5 that is not shown in those figures.

Returning to FIG. 5, the remaining portions of mask 11 and the portions of the rear surface electrode 7 and of the GaAs wafer 100 that are not masked by PHS 8 are successively etched and removed. These etching and removal steps divide the wafer 100 into a plurality of FET devices 1, each with its substrate 2, as indicated in FIG. 5(e). The separated FET devices 1 are released from the glass plate 22 by dissolving the wax or other resin 21. Then the FET devices are tested. Frequently the devices are designed for and are operated at microwave frequencies. The electrical characteristics of those FET devices are measured with a special high frequency, low VSWR jig in which electrode 7 is contacted at the rear surface of the substrate 2, and the drain 4 and gate 5 are contacted at the front surface. Those devices that function properly are employed and the others are discarded. The handling of the devices 1 in order to carry out testing exposes them to mechanical damage. It would be preferable to test the devices before separating them from the wafer 100 to reduce damage, thereby increasing yields, and to save time.

In the FET devices described with respect to FIG. 5, the lateral surfaces of the GaAs substrate 2, i.e, the side wall surfaces joining the front and rear surfaces, of the individual devices are exposed. During packaging and testing, the devices are repeatedly handled. The substrate 2 may crack during this handling when tweezers are employed to grasp the devices 1. Moreover, during die bonding employing automated bonding equipment, a vacuum chuck or tweezers for engaging a device may come into direct contact with the GaAs substrate 2, severely damaging it. The damage from handling reduces overall yields and increases the cost of the acceptable devices. It would, therefore, be desirable to provide protection for the lateral surface of the substrate.

In the FET devices described by Saito et al, those side walls are protected by a plated gold layer.

In order to achieve high production yields with the prior art production process described, the resist mask 11 has to be precisely aligned with the electrode pattern. After its use, mask 11 must be completely removed. If the patterns of the resist mask 11 and the electrodes on the substrate 2 are misaligned, the PHS 8 will not be properly positioned, adversely affecting the FET device characteristics. Furthermore, as shown in FIG. 8, faults can occur in the edge of the resist mask 11. As shown in FIG. 6, these edge faults can produce irregular lateral surface portions C in the PHS 8, the rear surface electrode 7, and the GaAs substrate 2. An FET device 1 with such lateral surface variations cannot be mounted on a carrier having a precisely controlled size.

In processing to prepare high power FETs having a PHS, a mask alignment step between a pattern at the front surface and one at the rear surface is usually required. In FIG. 5(d) for example, mask 11 has to be aligned relative to the locations of via-holes 9. While the alignment tolerances required are not unreasonably difficult to achieve, alignment of masks on opposite sides of a wafer presents difficult problems. Usually, the alignment is carried out with the aid of infrared light that is shone on one side, passes through the substrate and via-holes, and is detected at the opposite side. That infrared alignment step must be completed before any metallizations that can block the transmission of infrared light are deposited on the wafer. Thus, it would be desirable to employ a process for making high power FETs like those of FIG. 4 that avoids the necessity of aligning masks on opposite sides of a wafer.

The external configuration, size, and clearances of the PHS 8 are principally determined by the thickness of the plated gold layer of the PHS 8 and the planarity of its plated side walls. The GaAs substrate 2 itself is defined by etching using the PHS 8 as a mask. Therefore, in order to achieve the desired dimensional precision of the substrate, the configuration of the plated layer must be precisely controlled so that no irregularities occur in the patterning of the resist mask 11 and the etching of the rear surface electrode 7. In addition, no unwanted residual portions of the mask 11 and electrode 7 must be left in place after the etching. However, it is difficult to remove the resist mask 11 completely and to obtain a smooth lateral surface along the rear surface electrode 7.

The manner of etching of the resist mask 11 is illustrated in FIGS. 7(a) and 7(b) which show enlarged views of the region within the circle D from FIG. 5(d). As the plated PHS 8 increases in thickness, it extends onto the resist mask 11 as shown in FIG. 7(a). In the example described, the PHS 8 extends across about 45 microns of the 3 micron thick resist mask 11. It is quite difficult to completely remove the resist 11 that has been covered by the PHS 8, especially at the innermost portions under PHS 8. As shown in FIG. 7(b), some residual part of the resist 11 may not be removed. When the rear surface electrode 7 and the GaAs substrate 2 are etched to separate the wafer into the FET devices 1, the residual resist, indicated as 11a in FIG. 7(b), is not etched, resulting in variations in the lateral surfaces of the substrate 2 as shown in FIG. 6 as portions B. Accordingly, it would be desirable to eliminate the sequential masking, plating, and etching steps at the rear surface of the FET device 1.

SUMMARY OF THE INVENTION

An object of the present invention is to provide semiconductor devices that may be fabricated in large numbers on a wafer, that may be easily separated from each other and the wafer without damaging the devices, and that may be easily tested from the front surface before separation from the wafer.

An additional object of the invention is to provide an FET device that may be readily handled without damage and that has precise outside dimensions.

Another object of the present invention is to provide a method for producing such an FET device, particularly a method that avoids any front to rear surface mask alignment steps.

Other objects and advantages of the present invention will become apparent from the detailed description given hereinafter. It should be understood, however, that the detailed description and specific embodiment are given only by way of illustration since various modifications and additions within the spirit and scope of the invention will be apparent to those of skill in the art.

According to one aspect of the invention, a large number of FET devices are fabricated on a single wafer that acts as a common substrate for the devices. The devices each include at least one via-hole extending into the wafer from the front surface for connecting one of the electrodes, usually the source electrode, to an electrode disposed on the rear surface of the device substrates. At least one circumferential separation groove extending into the wafer from the front surface toward the rear surface and lying outwardly from an FET device is used for separating the wafer into a plurality of devices. A metallic electrode, preferably gold, is disposed in the via-hole and in the separation groove of each device.

When the wafer is formed into dice along the separation grooves, the metallic electrodes provide a side wall protection layer at the side surface of each of the FET devices to protect them during subsequent handling. Preferably, the separation grooves are wider and deeper than the via-holes for easier separation of the devices from the wafer by a chemical and/or mechanical means. The side wall protection layer preferably extends onto the front surface of the individual devices to permit measurement of the electrical characteristics of the devices before the wafer is separated into individual dice. A plated heat sink is disposed at the rear surface of the wafer in contact with an electrode for dissipating heat and increasing the power handling capacity of the device.

Each individual FET device according to the invention includes a substrate having at least one via-hole extending through it and a metallic layer disposed in the via-hole connecting a source electrode on the front surface of the substrate with an electrode disposed on the rear surface of the substrate. That rear surface electrode has disposed on it a plated heat sink for dissipating heat generated during operation of the device. The side walls of the substrate lying between the front and rear surfaces are covered with a metallic protection layer, preferably gold, that has been commonly deposited with the metallic layer in the via-holes. The gate and drain electrodes are disposed on the front surface of the FET device along with measurement electrodes extending from the side wall protection layer. All of the electrodes of the FET device are available at the front surface to permit testing of the electrical characteristics of the devices before the separation of the wafer into individual FET devices.

FET devices according to the invention are formed in a substrate at an active region of the substrate. The electrodes of the device are deposited on a front surface of the substrate in a predetermined relationship to each other. At least one via-hole is etched through the substrate from the front surface. A circumferential separation groove spaced from the active region of each device is etched from the front surface and is preferably wider and deeper than the via-hole. A metallic layer is deposited in the via-hole and separation groove from the front surface of the substrate. The thickness of the substrate is reduced from the rear surface, preferably in a combined chemical and mechanical process. A second metal layer is deposited on the rear surface of the substrate in contact with the metallic layer in the via-hole. A heat sink is plated on the rear surface electrode and each device is separated from its neighbors on a wafer along the separation grooves. The separation may take place by etching, mechanical severing, or a combination of those processes. The metallic layer deposited in the separation grooves protects the side walls of the substrate during handling. That protection layer may extend onto the front surface of the substrate to provide measurement electrodes so that all electrodes of an FET device are accessible from the front surface of the substrate for testing before separation of the devices from the wafer. The metallic layers and plated heat sink are preferably electrolytically deposited gold.

BRIEF DESCRIPTION OF THE DRAWING FIGURES

FIG. 1 is a perspective view of the structure of an FET device according to an embodiment of the present invention.

FIGS. 2(a)–2(e) are cross-sectional diagrams illustrating a production process for the FET device of FIG. 1.

Figure 4:
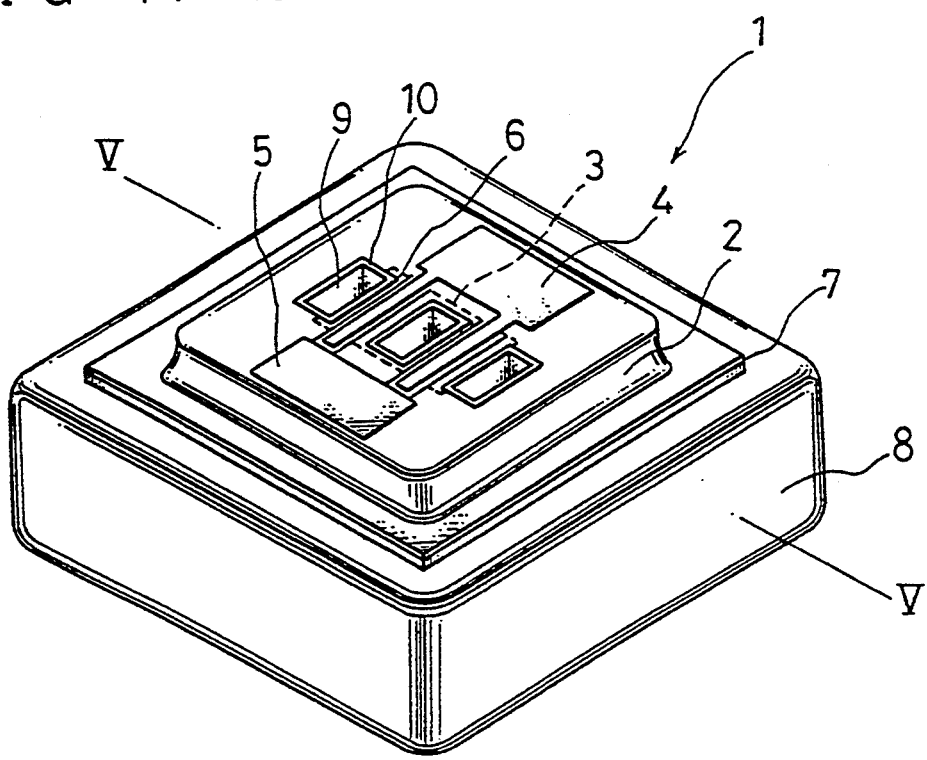
FIG. 4 is a perspective view showing the structure of a prior art FET device.

FIGS. 5(a)–5(e) are cross-sectional diagrams illustrating a production process for the FET device of FIG. 4.

Figure 6:
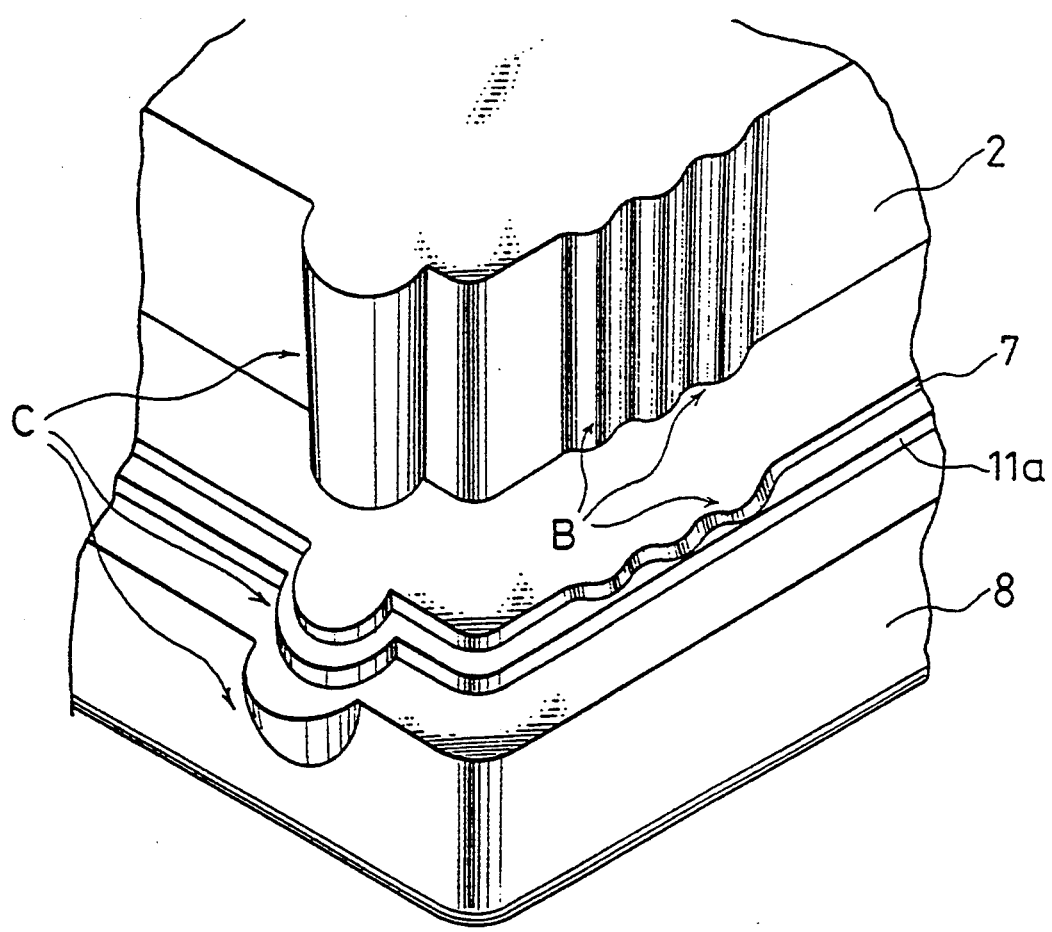

FIG. 6 is an enlarged view of a portion of FIG. 4 illustrating problems in the prior art production method.

Figure 7A:
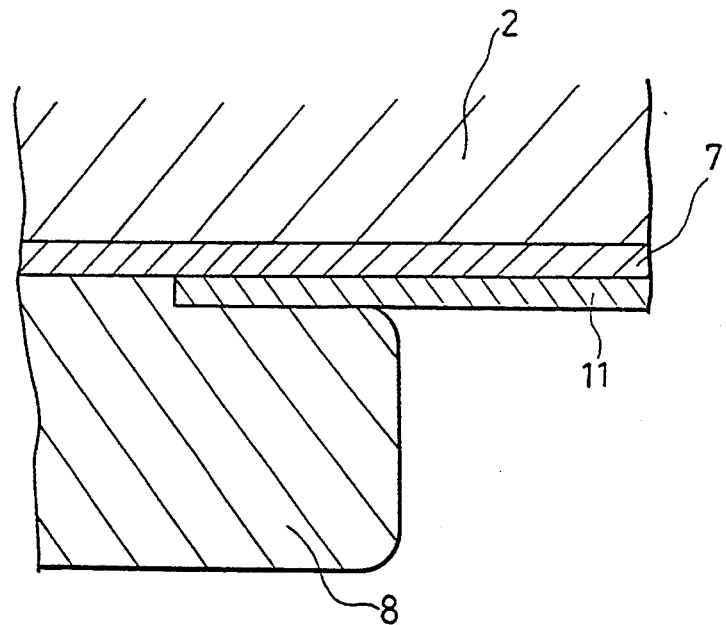
Figure 7B:
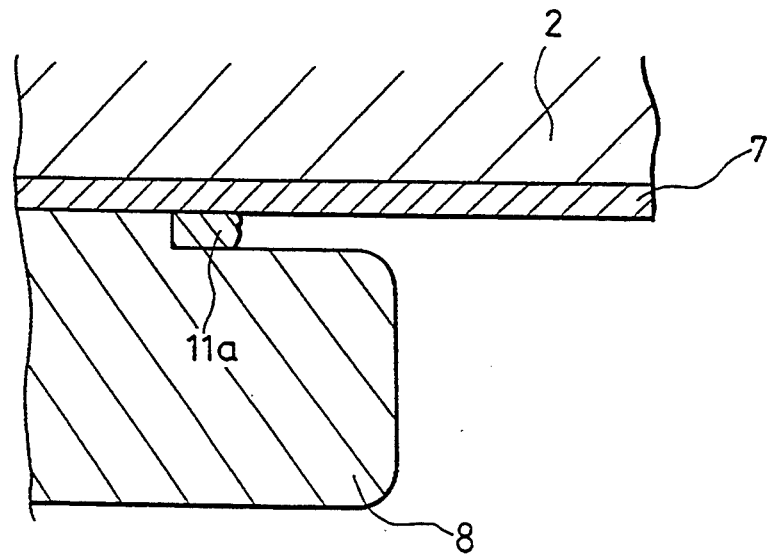

FIGS. 7(a) and 7(b) are cross-sectional diagrams illustrating removal of a resist mask in the prior art production method.

Figure 8:
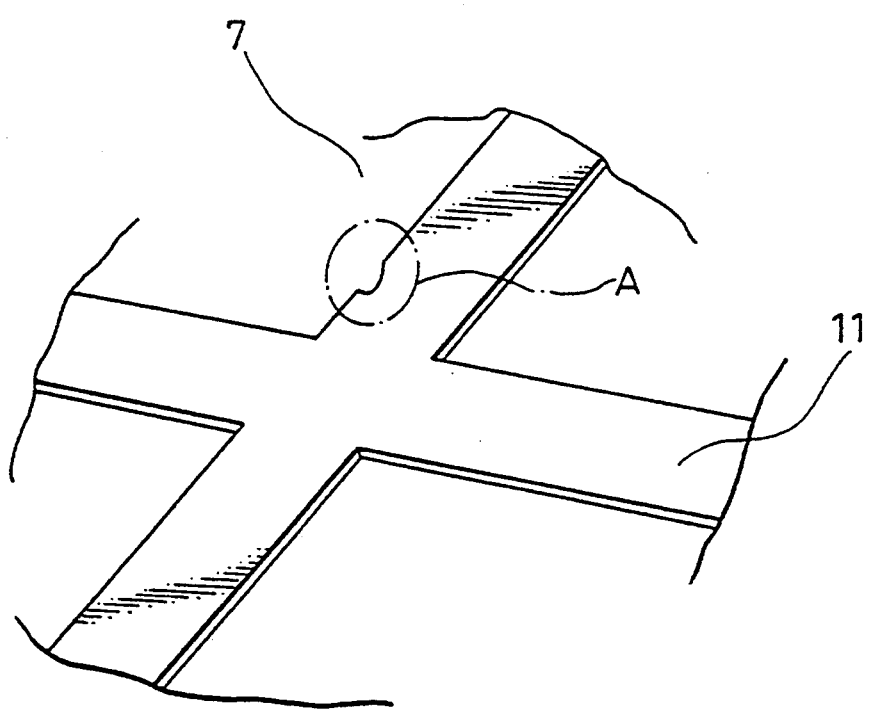

FIG. 8 is a diagram showing an edge fault in a resist mask.

Figure 9:
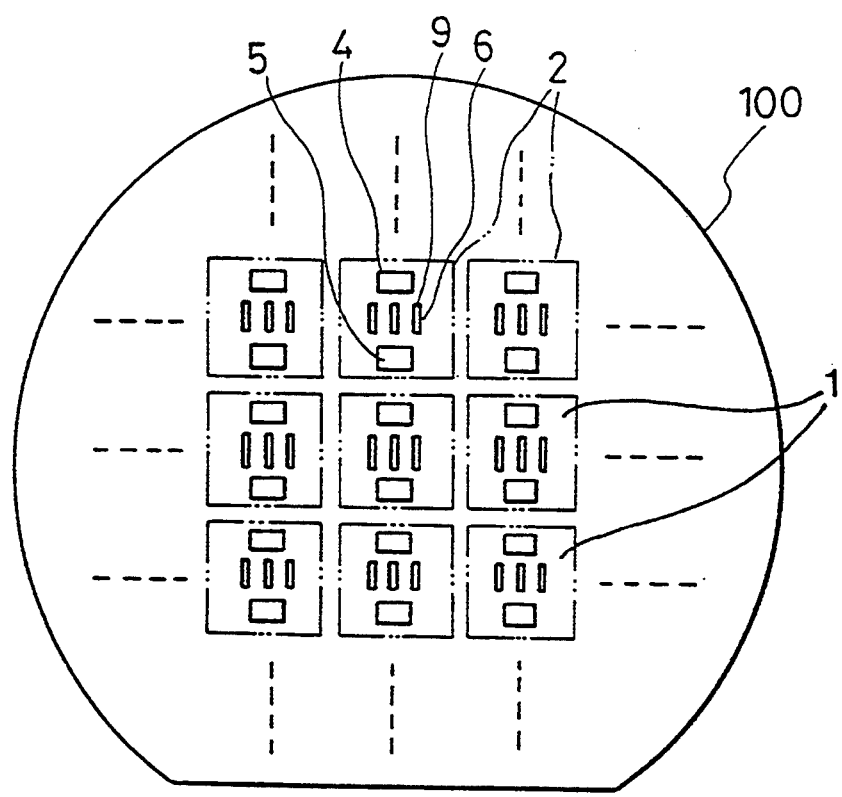

FIG. 9 is a diagram showing a plurality of prior art FET devices on a single wafer.

DETAILED DESCRIPTION OF PREFERRED EMBODIMENTS

Figure 1:
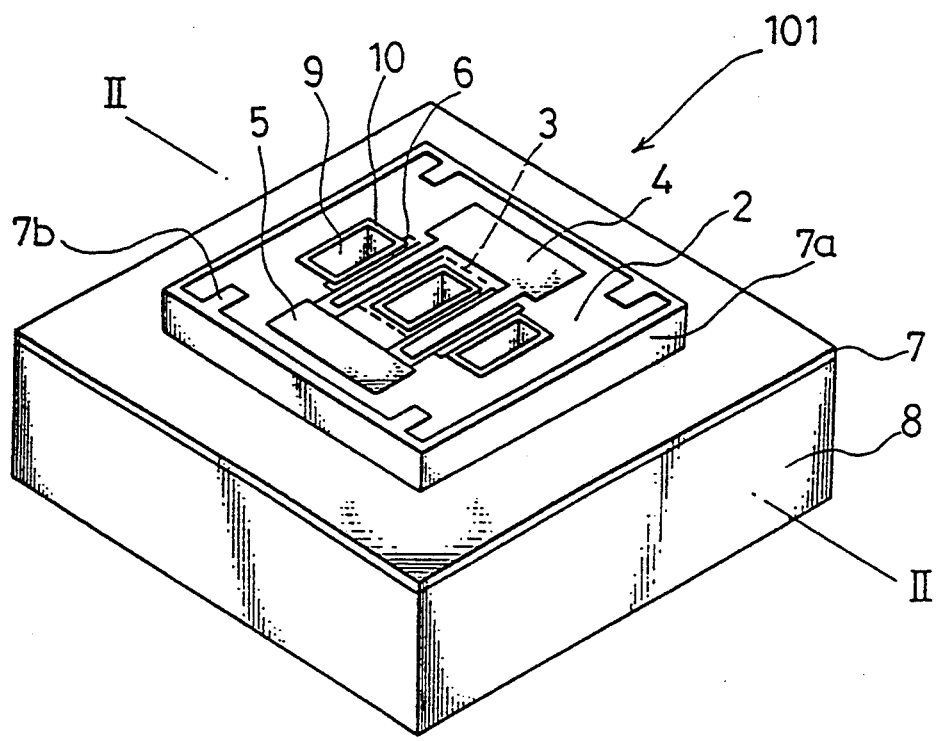

FIG. 1 is a perspective view of a high power FET device 101 according to an embodiment of the invention. (Like elements of FET device 1 of FIG. 4 and FET device 101 of FIG. 1 are given the same reference numbers.) FET device 101 includes an active region 3, a drain electrode 4 having two drain fingers, a gate electrode 5 including four gate fingers, and three source electrodes 6. A measurement electrode 7b on the front surface of the GaAs substrate 2, an electrode 7 at the rear surface, the side surface protection layer 7a, and the PHS 8 are all gold that is formed by plating. The via-hole electrodes 10 disposed on the internal surfaces of the via-holes 9 extend through the substrate 2 from the front surface to the rear surface. The electrode 7 disposed at the rear surface of the GaAs substrate 2 is connected with the source electrode 6 through the plated via-hole electrodes 10.

As shown in FIG. 1, FET device 101 includes a gold protection layer 7a covering the lateral or side surfaces of the GaAs substrate 2 between the front and rear surfaces of the substrate. Measurement electrodes 7b are disposed on the front surface of the GaAs substrate 2 in electrical communication with the rear surface electrode 7 and source electrodes 6 through the protection layer 7a. Measurement electrodes 7b, along with gate and drain electrodes 4 and 5, enable testing of the electrical characteristics of FET device 101 from its front surface.

Figures 2A, 2B, 2C:
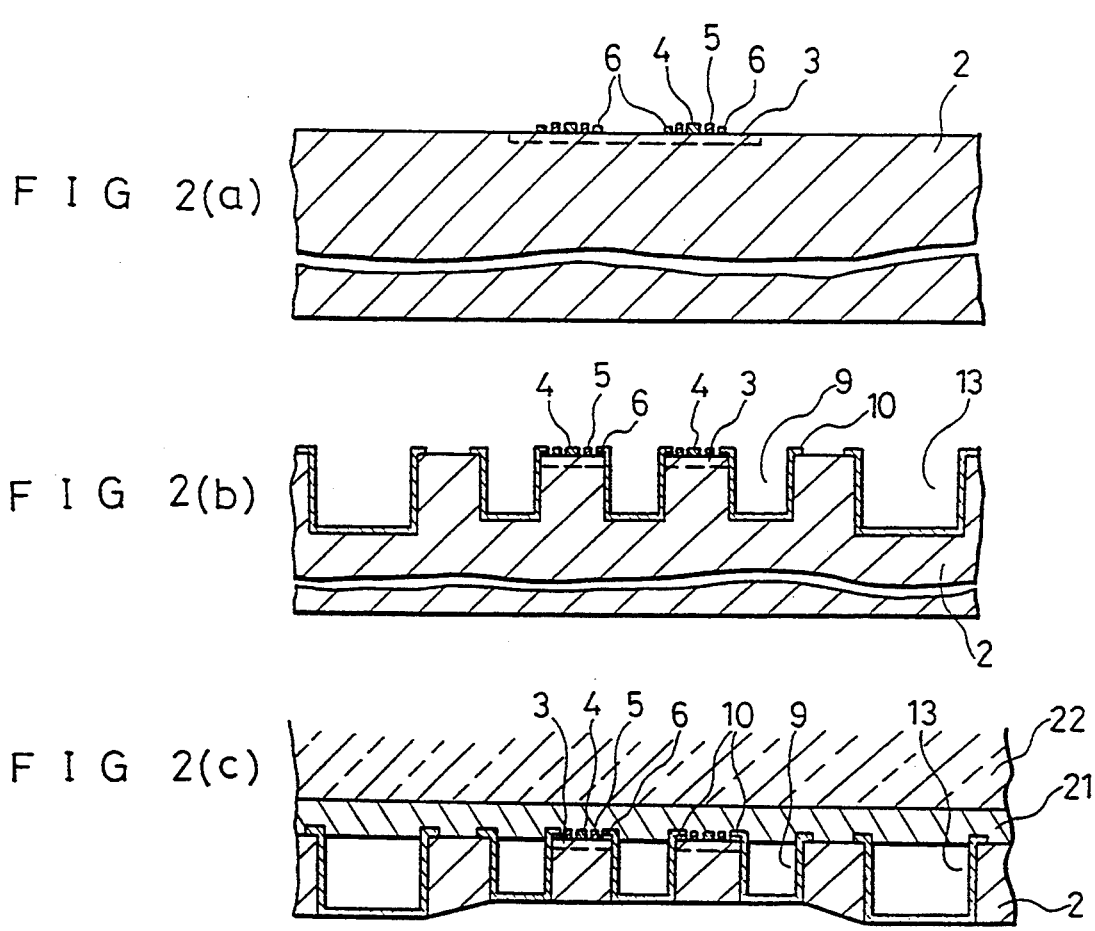
Figure 2D:
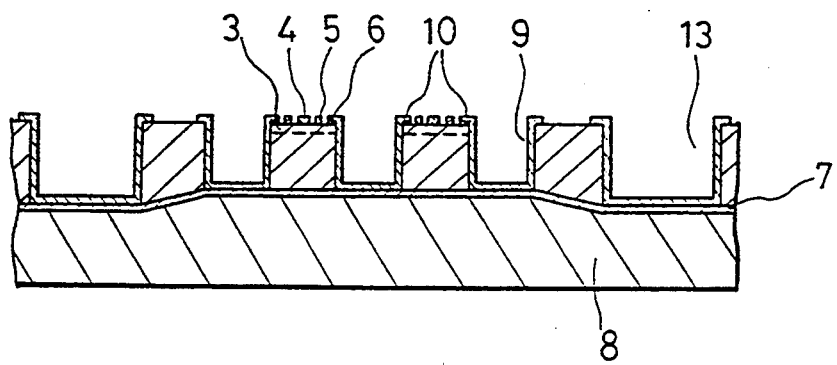
Figure 2E:
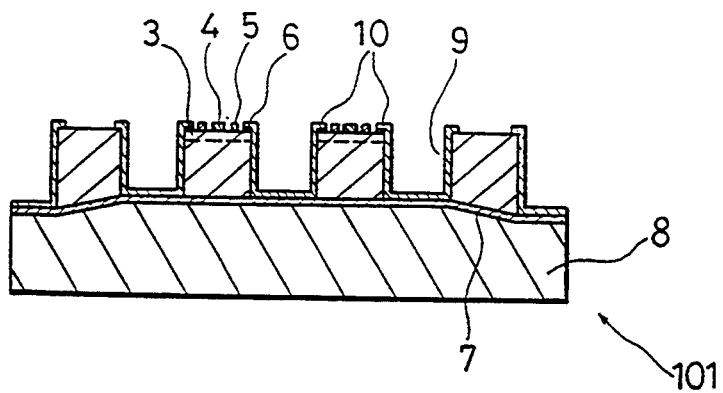
Figure 3:
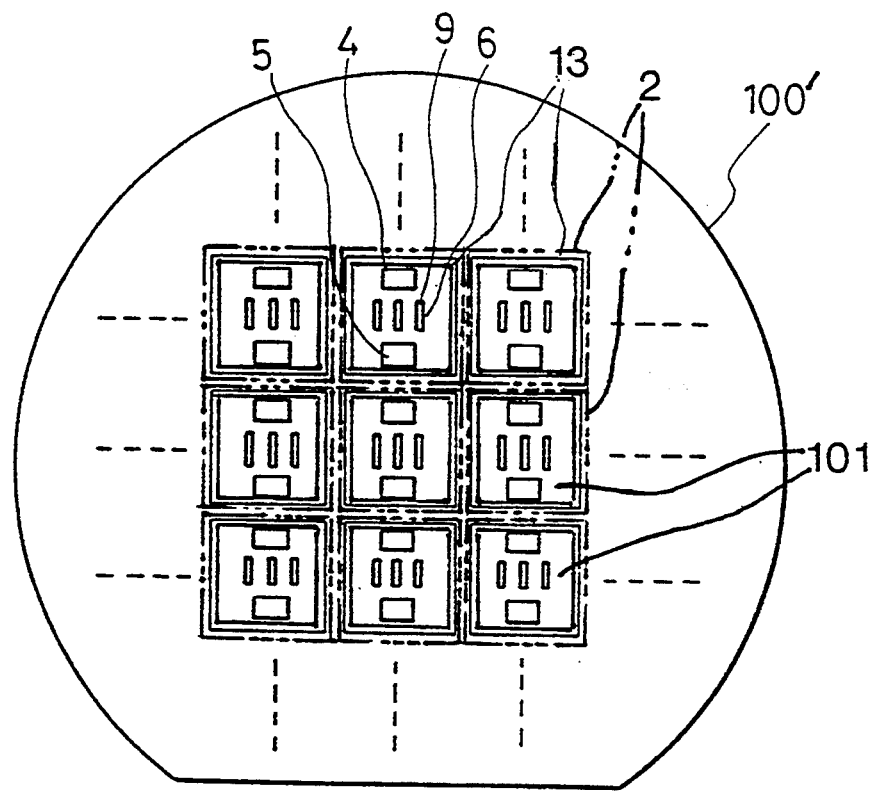
FIG. 3 is a diagram showing a plurality of FET devices on a single wafer according to an embodiment of the invention.
Figure 5A:
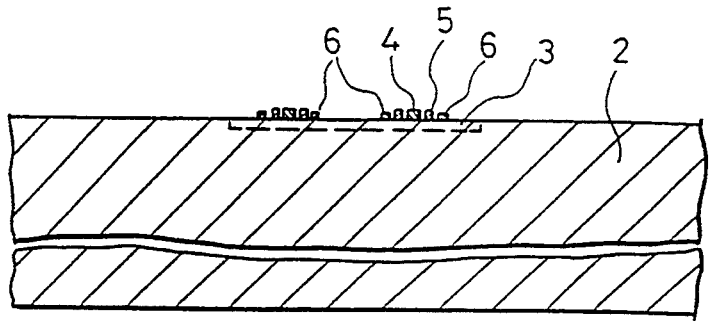
Figure 5B:
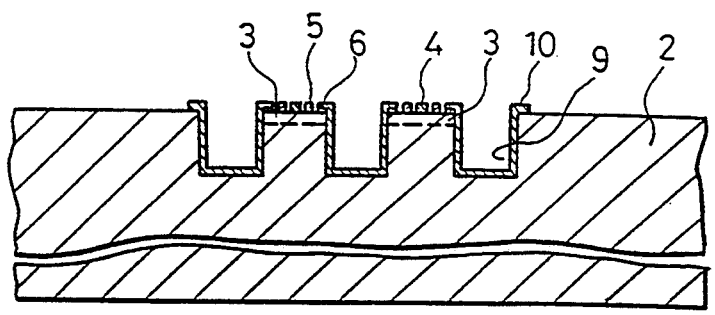
Figure 5C:
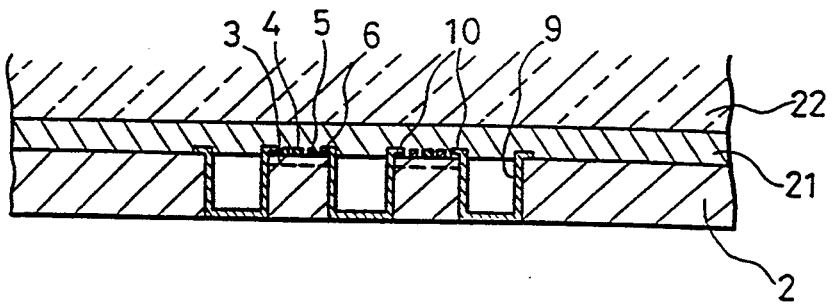

The FET device 101 may be produced by the process steps illustrated in FIGS. 2(a)-2(e). In FIGS. 2(a)-2(e), a single FET device 101 is shown in cross-section. In general, as illustrated in FIG. 3, a plurality of FET devices 101 are formed in a matrix arrangement on a wafer 100′. Thus, the FET device 101 of FIGS. 2(a)-2(d) includes eight contiguously attached, but unillustrated, FET devices 101 all having wafer 100′ as a common substrate 2.

The terms wafer 100′ and substrate 2 are generally interchangeable until the wafer is divided into individual dice, each containing an FET device 101. In FIG. 2(a), an active region 3 is formed in a portion of the front surface of the substrate 2 by ion implantation. A drain electrode 4 having two drain fingers, a gate electrode 5 having four gate fingers, and four source electrode elements 6 are deposited and formed in the desired arrangement on the front surface of the GaAs substrate 2 in the same manner as described with respect to FIG. 5(a).

Via-holes 9 are formed in the wafer 100′ from the front surface to a depth of about 30 microns by an etching technique. Circumferential separation grooves 13 for separating the FET devices 101 from wafer 100′ are also formed in the GaAs wafer 100′ extending from the front surface toward the rear surface. These separation grooves 13 are referred to as circumferential because each surrounds a respective FET device 101. Each groove 13 in plan view may have any shape that is spaced from the active region and electrodes of the respective surrounded FET device 101. In the embodiment of FIG. 3, the grooves are rectangular in plan view so that the resulting FET devices 101 are rectangular. In the embodiment of FIG. 3, the separation grooves 13 for different FET devices 101 are spaced from each other, but adjacent devices could employ common separation grooves.

Grooves 13 may be formed either at the same time as via-holes 9 are formed or, at least partially, thereafter. The separation grooves 13 are preferably wider and deeper than via-holes 9. The formation of both the via-holes 9 and the separation grooves 13 may be carried out at the same time employing a dry etching technique, such as reactive ion etching. In that case, grooves 13 are etched longer than via-holes 9 are etched. If a wet, chemical etching technique is used, the via-holes 9 and the separation grooves 13 may be etched simultaneously. Since the separation grooves 13 are wider than the via-holes 9, the widths being defined by a mask, such as a photoresist mask, the separation grooves 13 are etched deeper by a single chemical etching step than are the via-holes 9. If a relatively large difference in the depths of the via-holes 9 and the separation grooves 13 is desired, a two-step etching process is likely to be required regardless of the etching technique employed. A dry etching process may produce via-holes and grooves having nearly square, i.e., right angle, internal and external corners, as shown in FIG. 2(b). Chemical etching is more likely to produce rounded corners in the grooves instead of sharply angled corners. Rounded corners on FET devices 101, especially at the edges of substrate 2, may provide better protection against cracking during handling. However, dry etching is preferred over wet etching because it permits better control of the area etched and the depth of the etching.

After the formation of the via-holes 9 and the separation grooves 13, the via-hole electrodes 10 are deposited on the internal surfaces of the via-holes 9 and of the separation grooves 13 as shown in FIG. 2(b). Electrodes 10 are preferably plated gold and have a thickness of about 3 microns. The source, drain, and gate electrodes and their respective finger elements may be protected by a photoresist mask during the plating of electrodes 10. In that case, subsequent removal of the protective mask lifts off any metal plating that builds up on masked areas on the front surface of the wafer 100′. Generally, the areas adjacent the via-holes and grooves are plated as shown in FIG. 2(b).

The front surface of the GaAs wafer 100′ is mounted on a glass plate 22 with wax 21 or another removable adhering material as in the prior art method. The thickness of the wafer 100′ is reduced by polishing the rear surface of the substrate until the electrodes 10 are exposed. Preferably, a combined mechanical and chemical polishing technique is employed, i.e., mechanical rubbing combined with the application of a relatively slow etchant to produce the rear surface configuration of FIG. 2(c). Generally, a non-planar rear surface is produced on wafer 100′ when the separation grooves 13 are deeper than the via-holes 9. The plating of electrodes 10 is not attacked by the etchant and the etching rate adjacent the separation grooves 13 is reduced when the electrodes 10 are exposed. However, etching continues at the same rate elsewhere. The resulting wafer configuration includes a thicker substrate portion adjacent the separation grooves 13 than adjacent the via-holes 9. The electrodes 10 in the via-holes 9 are exposed when the thickness of the substrate 2 is reduced to about 25 to 30 microns.

Successively deposited layers of titanium and gold or nickel and gold are deposited on the rear surface of the reduced thickness wafer 100′ by a vacuum deposition technique or an electroless plating method. A temporary third layer, e.g., titanium, may be employed to protect the gold layer until just before plating of the PHS 8. The temporary layer is removed before PHS plating begins. The deposited metal layers produce the rear surface electrode 7. A gold PHS is deposited, for example, by electrolytic plating, on the electrode 7 to a thickness of about 60 microns as shown in FIG. 2(d).

Wafer 100′ is detached from glass plate 22 by dissolving the adhering material 21. The PHS 8 is fractured or cut, for example, by a dicer, along the separation grooves 13 to separate the FET devices 101 from the wafer 100′ as indicated in FIG. 2(e). Since electrode 10 was deposited in separation grooves 13, the lateral surfaces of the separated FET devices 101 are plated with metal, i.e., electrode 10. That plating, preferably gold, is the protection layer 7a of FIG. 1. Measurement electrodes 7b are formed in the same plating step that produces protection layer 7a. During the masking for the electrode layer 10, as shown in FIG. 2(b), additional portions are provided on the front surface of the wafer 100' so that measurement electrodes 7b are formed. Measurement electrodes 7b are produced either by masking the gold plating to protect it during etching or by appropriately masking the substrate during plating when the lift-off method is employed.

Since the lateral walls of the GaAs substrate 2 are covered with a metal protection film 7a, the weak GaAs substrate 2 is protected from mechanical damage. Even when the substrate is picked up by tweezers, the tweezers do not directly contact the GaAs substrate 2, greatly improving the ability to handle the FET device 101 without damage. A still further improvement in resistance to mechanical damage is provided when protection film 7a is concave, i.e., when wet etching is employed to form the grooves 13 rather than dry etching. The curved surface spreads the forces applied by the tweezers, reducing the pressure applied to the fragile substrate.

The measurement electrodes 7b on the front surface of the substrate permit the source, drain, and gate electrodes all to be accessed from the front side of the wafer 100'. Therefore, the electrical characteristics of each FET device 101 can be measured from the front side of the wafer 100' during the production process, i.e., before the wafer 100' is divided into individual devices. The front surface access means a high frequency jig or connector can be temporarily applied to wafer 100' for the evaluation of each FET device 101. This arrangement provides a significant improvement over FET devices 1 which cannot be evaluated without connecting a jig to both the front and rear surfaces. Thus, FET devices 1 could not be tested until wafer 100 was cut into dice.

Preferably the FET devices 101 are spaced apart from each other on the wafer 100'. The division of the wafer 100' into FET devices 101 is preferably accomplished by etching from the front surface of the wafer in the areas between devices 101, i.e., between the spaced apart separation grooves 13. Thereafter, PHS 8 is cut at the rear surface. The FET devices 101 are finally fully separated from each other, for example, with a conventional dicing apparatus. Severing preferably takes place along the separation grooves 13, producing the device shown in FIG. 2(e) with metal plating on its side surfaces.

The process for separating wafer 100' into individual devices is based solely on the pattern on the front surface of the substrate 2. Thus, there is no need to apply a separation pattern on the rear side of the substrate. In some previously known processes, individual separation patterns are required for opposite sides of the substrate. In order to achieve the desired separation, those patterns must be aligned or the resulting devices may be defectively formed. As discussed in the background section, alignment of individual patterns on the front and rear surfaces of a wafer is a cumbersome process requiring use of infrared light and adjustment of the sequence of the process steps so that metallizations that could interfere with the infrared light are not deposited until after the alignment step is completed. However, in the invention a front-to-back surface mask alignment is unnecessary. The avoidance of such a pattern alignment step means that the wafer 100' can be separated into FET devices 101 with a high degree of dimensional precision.

Since the via-holes 9 and the separation grooves 13 in the FET device 101 are produced at the same time from the same pattern, there are no misalignment errors between the holes and grooves that can arise when those features are separately defined in different patterning steps. The plating 10 in the separation grooves 13, which are preferably deeper than the via-holes 9, can be used as a target at the rear surface to detect the conclusion of the first portion of the polishing process in which the thickness of the GaAs wafer 100' is reduced. The polishing can be temporarily stopped when electrode 10 in the bottom of the separation groove is initially detected. Thereafter, polishing may be resumed until electrode 10 is exposed at the bottom of the via-holes 9. The detection of the exposed electrodes 10 in via-holes 9 to indicate an etching stopping point eliminates any need to monitor the thickness of the wafer 100' during the polishing process.

Although the invention has been described with respect to certain preferred embodiments, many variations are possible. Separation grooves 13 can be formed with dicing apparatus or by a separate etching step. The depths of the via holes 9 and the separation grooves 13 can be made equal to each other. Furthermore, the via-holes 9 and the separation grooves 13 may be separately metallized. Although the invention has been described with respect to an embodiment of an FET device having a via-hole electrode structure, the invention may also be applied to other circuit elements and to integrated circuits incorporating via-hole electrode structures.

We claim:

1. A method of making semiconductor devices comprising:

forming at least one active region at the front surface of a semiconductor wafer having opposed front and rear surfaces;

depositing at least two electrodes in a predetermined relationship with each other on the front surface of the wafer at the active region;

etching at least one via-hole in the wafer from the front surface and extending toward the rear surface adjacent the electrodes at the active region;

etching at least one circumferential separation groove outwardly spaced from the active region in the wafer from the front surface and extending toward the rear surface for separating a portion of said wafer as a semiconductor device;

depositing a first metallic layer in the at least one via-hole and in the at least one separation groove and on the front surface adjacent the via-hole in contact with one of the electrodes and adjacent the separation groove as a measurement electrode;

reducing the thickness of the wafer at the rear surface to expose the first metallic layer;

depositing a second metallic layer on the rear surface in electrical communication with the first metallic layer in the via-hole;

forming a heat sink on the second metallic layer by plating; and dividing the wafer at the separation groove to form an individual semiconductor device on a heat sink having a metallic protection layer on the lateral walls of the substrate between the front and rear surfaces.

2. The method of claim 1 including forming said active region by implanting impurity ions in the wafer.

3. The method of claim 1 wherein depositing at least two electrodes comprises forming two electrodes making ohmic contact to the active region of the wafer as source and drain electrodes, respectively, and forming a gate electrode making a Schottky barrier with the wafer interposed between said source and drain electrodes.

4. The method of claim 1 including etching the via-hole and the separation groove simultaneously.

5. The method of claim 1 including dry etching the via-hole and the separation groove.

6. The method of claim 1 including wet etching the via-hole and the separation groove.

7. The method of claim 1 including depositing gold as the first metallic layer.

8. The method of claim 1 including reducing the thickness of the wafer by combined mechanical and chemical polishing.

9. The method of claim 1 including forming the heat sink by plating gold on the second metallic layer.

10. The method of claim 1 including dividing said wafer by severing the wafer at the separation groove.

11. The method of claim 1 including dividing said wafer by etching the wafer at the separation groove.

* * * * *